United States Patent
Cliber et al.

(10) Patent No.: US 8,449,674 B2
(45) Date of Patent: May 28, 2013

(54) SYSTEM AND METHOD FOR LIQUID SILICON CONTAINMENT

(75) Inventors: James A. Cliber, Emmitsburg, MD (US); Roger F. Clark, Knoxville, MD (US); Nathan G. Stoddard, Gettysburg, PA (US); Paul Von Dollen, Frederick, MD (US)

(73) Assignee: AMG Idealcast Solar Corporation, Frederick, MD (US)

( * ) Notice: Subject to any disclaimer, the term of this patent is extended or adjusted under 35 U.S.C. 154(b) by 930 days.

(21) Appl. No.: 12/547,682

(22) Filed: Aug. 26, 2009

(65) Prior Publication Data
US 2010/0051108 A1    Mar. 4, 2010

Related U.S. Application Data

(60) Provisional application No. 61/117,595, filed on Nov. 25, 2008, provisional application No. 61/092,186, filed on Aug. 27, 2008.

(51) Int. Cl.
| | | |
|---|---|---|
| *C30B 9/00* | (2006.01) | |
| *C30B 11/00* | (2006.01) | |
| *C30B 17/00* | (2006.01) | |
| *C30B 21/02* | (2006.01) | |
| *C30B 28/06* | (2006.01) | |
| *C30B 35/00* | (2006.01) | |

(52) U.S. Cl.
USPC ............. 117/73; 117/200; 117/203; 117/206

(58) Field of Classification Search
USPC .................... 117/73, 200, 203, 206
See application file for complete search history.

(56) References Cited

U.S. PATENT DOCUMENTS

| | | | | |
|---|---|---|---|---|
| 5,871,582 A | * | 2/1999 | Kawashima | ............... 117/213 |
| 2007/0195852 A1 | * | 8/2007 | Clark et al. | ................ 373/118 |

FOREIGN PATENT DOCUMENTS

| | | |
|---|---|---|
| EP | 0810 305 A1 | 12/1997 |
| EP | 1 754 807 A2 | 2/2007 |
| JP | 0 2 225 393 | 9/1990 |
| JP | 0 6 340 491 | 12/1994 |
| JP | 10 139 581 | 5/1998 |
| JP | 2000143393 A | 5/2000 |
| JP | 2000169295 A | 6/2000 |
| JP | 2000211994 A | 8/2000 |
| JP | 2002137996 A | 5/2002 |
| JP | 2003055090 A | 2/2003 |
| JP | 2006232569 A | 9/2006 |

* cited by examiner

*Primary Examiner* — James McDonough
(74) *Attorney, Agent, or Firm* — Barnes & Thornburg LLP; Thomas J. McWilliams; Edward F. Behm, Jr.

(57) ABSTRACT

This invention relates to a system and a method for liquid silicon containment, such as during the casting of high purity silicon used in solar cells or solar modules. The containment apparatus includes a shielding member adapted to prevent breaching molten silicon from contacting structural elements or cooling elements of a casting device, and a volume adapted to hold a quantity of breaching molten silicon with the volume formed by a bottom and one or more sides.

7 Claims, 2 Drawing Sheets

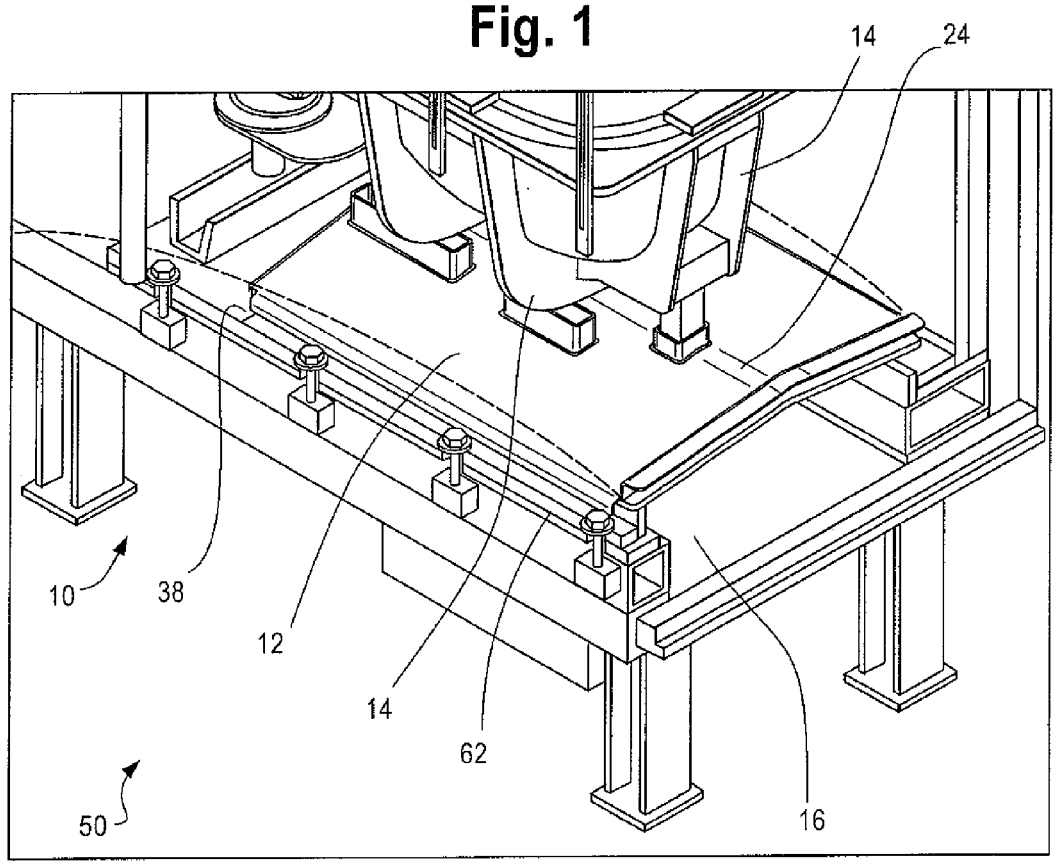
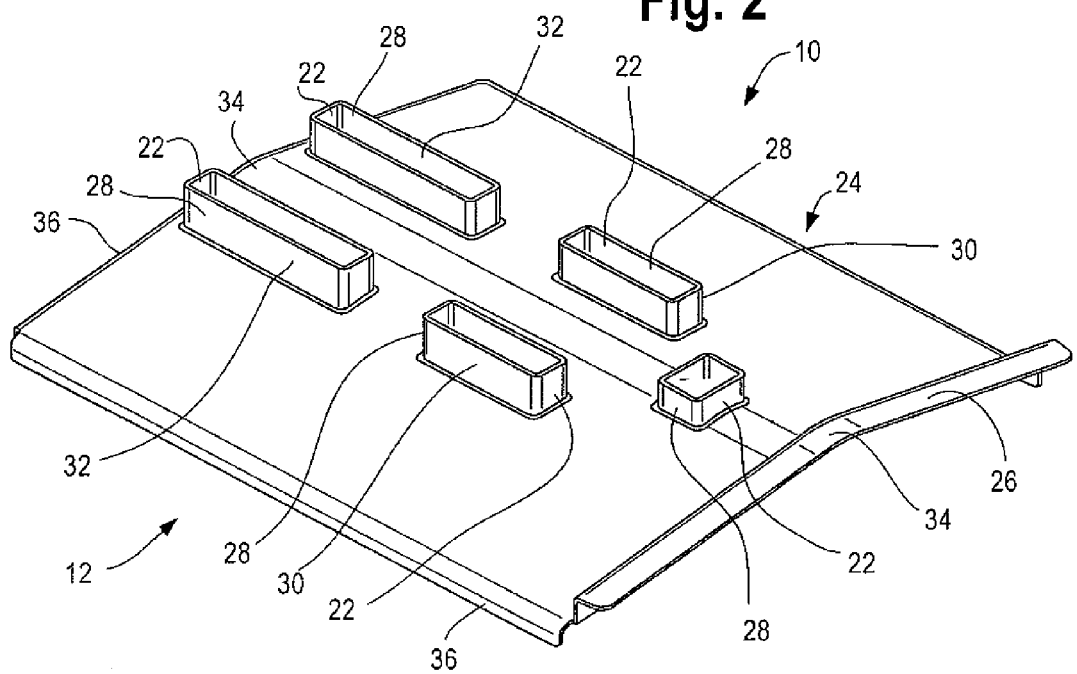

SYSTEM AND METHOD FOR LIQUID SILICON CONTAINMENT

This application claims the benefit of U.S. Provisional Application No. 61/117,595, filed Nov. 25, 2008, and U.S. Provisional Application No. 61/092,186, filed Aug. 27, 2008, the entirety of both are expressly incorporated herein by reference.

This invention was made with U.S. Government support under Cooperative Agreement No.: DE-FC36-07G017049 under prime contract with the National Renewable Energy Laboratory awarded by the Department of Energy. The Government has certain rights in this invention.

BACKGROUND

1. Technical Field

This invention relates to a system and a method for liquid silicon containment, such as during the casting of high purity silicon used in solar cells or solar modules.

2. Discussion of Related Art

Photovoltaic cells convert light into electric current. One of the most important features of a photovoltaic cell is its efficiency in converting light energy into electrical energy. Although photovoltaic cells can be fabricated from a variety of semiconductor materials, silicon is generally used because it is readily available at reasonable cost, and because it has a suitable balance of electrical, physical, and chemical properties for use in fabricating photovoltaic cells.

In a known procedure for the manufacture of photovoltaic cells, silicon feedstock is doped with a dopant having either a positive or negative conductivity type, melted, and then crystallized by pulling crystallized silicon out of a melt zone into ingots of monocrystalline silicon (via the Czochralski (CZ) or float zone (FZ) methods). For a FZ process, solid material is fed through a melting zone, melted upon entry into one side of the melting zone, and re-solidified on the other side of the melting zone, generally by contacting a seed crystal.

Recently, a new technique for producing monocrystalline or geometric multicrystalline material in a crucible solidification process (i.e. a cast-in-place or casting process) has been invented, as disclosed in U.S. patent application Ser. Nos. 11/624,365 and 11/624,411, and published in U.S. Patent Application Publication Nos.: 20070169684A1 and 20070169685A1, filed Jan. 18, 2007. Casting processes for preparing multicrystalline silicon ingots are known in the art of photovoltaic technology. Briefly, in such processes, molten silicon is contained in a crucible, such as a quartz crucible, and is cooled in a controlled manner to permit the crystallization of the silicon contained therein. The block of cast crystalline silicon that results is generally cut into bricks having a cross-section that is the same as or close to the size of the wafer to be used for manufacturing a photovoltaic cell, and the bricks are sawn or otherwise cut into such wafers. Multicrystalline silicon produced in such manner is composed of crystal grains where, within the wafers made therefrom, the orientation of the grains relative to one another is effectively random. Monocrystalline or geometric multicrystalline silicon has specifically chosen grain orientations and (in the latter case) grain boundaries, and can be formed by the new casting techniques disclosed in the above-mentioned patent applications by melting in a crucible the solid silicon into liquid silicon in contact with a large seed layer that remains partially solid during the process and through which heat is extracted during solidification, all while remaining in the same crucible. As used herein, the term 'seed layer' refers to a crystal or group of crystals with desired crystal orientations that form a continuous layer. They can be made to conform to one side of a crucible for casting purposes.

In order to produce high quality cast ingots, several conditions should be met. Firstly, as much of the ingot as possible should have the desired crystallinity. If the ingot is intended to be monocrystalline, then the entire usable portion of the ingot should be monocrystalline, and likewise for geometric multicrystalline material. Secondly, the silicon should contain as few imperfections as possible. Imperfections can include individual impurities, agglomerates of impurities, intrinsic lattice defects and structural defects in the silicon lattice, such as dislocations and stacking faults. Many of these imperfections can cause a fast recombination of electrical charge carriers in a functioning photovoltaic cell made from crystalline silicon. This can cause a decrease in the efficiency of the cell.

Many years of development have resulted in a minimal amount of imperfections in well-grown CZ and FZ silicon. Dislocation free single crystals can be achieved by first growing a thin neck where all dislocations incorporated at the seed are allowed to grow out. The incorporation of inclusions and secondary phases (for example silicon nitride, silicon oxide or silicon carbide particles) is avoided by maintaining a counter-rotation of the seed crystal relative to the melt. Oxygen incorporation can be lessened using magnetic CZ techniques and minimized using FZ techniques as is known in the industry. Metallic impurities are generally minimized by being segregated to the tang end or left in the potscrap after the boule is brought to an end.

Known containment devices use metal or copper shields in attempts to rapidly dissipate the heat of fusion and solidify the molten silicon. These containment systems result in damage to the copper as some metal still melts and contaminates the silicon rendering it unfit for reuse.

However, even with the above improvements in the CZ and FZ processes, there is a need and a desire to produce high purity crystalline silicon that is less expensive on a per volume basis, needs less capital investment in facilities, needs less space, and/or less complexity to operate, than known CZ and FZ processes. There is a need and a desire for a safer process to cast silicon and provide containment of liquid silicon in the event of a breach. There is also a need and a desire for an apparatus that can be reused following a breach. There is also a need and a desire to be able to reuse the contained silicon in future casting cycles.

SUMMARY

This invention relates to a system and a method for liquid silicon containment, such as during the casting of high purity silicon used in solar cells or solar modules. This invention includes a safer process to cast silicon and provides containment of liquid silicon in the event of a breach, such as from preventing molten silicon damaging structural elements and/or cooling elements. The contained silicon can be reused in future casting cycles and the containment apparatus also can be reused after containing a breach of molten silicon.

According to a first embodiment, this invention relates to a containment apparatus suitable for use in producing high purity silicon. The apparatus includes a shielding member adapted to prevent breaching molten silicon from contacting structural elements or cooling elements, and a volume adapted to hold a quantity of breaching molten silicon with the volume formed by a bottom and one or more sides.

According to a second embodiment, this invention relates to a method of containing molten silicon suitable for use in producing high purity silicon. The method includes the step of breaching molten silicon from a casting process, and the step of preventing the molten silicon from contacting structural elements or cooling elements with a shielding member. The method also includes the step of holding a quantity of the molten silicon in a volume formed by a bottom and one or more sides.

BRIEF DESCRIPTION OF THE DRAWINGS

The accompanying drawings, which are incorporated in and constitute a part of this specification, illustrate embodiments of the invention and, together with the description, serve to explain the features, advantages, and principles of the invention. In the drawings:

FIG. 1 illustrates a partial isometric view of a casting device, according to one embodiment;

FIG. 2 illustrates an isometric view of a gabled structure, according to one embodiment;

DETAILED DESCRIPTION

Figure 3:
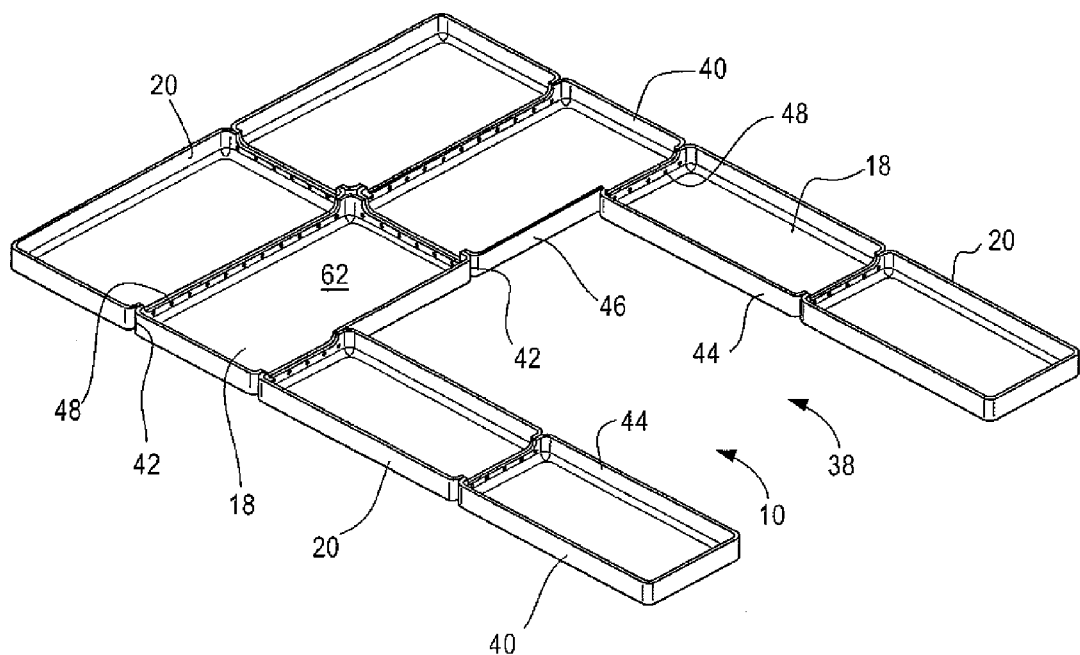
FIG. 3 illustrates an isometric view of a U-shaped pan, according to one embodiment.

This invention relates to a system and a method for liquid silicon containment, such as during the casting of high purity silicon used in solar cells or solar modules. Known silicon casting stations do not contain liquid silicon as well as desired and present operational issues or safety issues. Most known silicon casting furnaces employ a water-cooled steel jacket for heat extraction and/or vacuum containment. Silicon has a melting point of about 1420 degrees Celsius. Molten silicon can readily soften and/or melt steel structures (melting point of about 1300 degrees Celsius to about 1500 degrees Celsius depending upon the alloy). Molten silicon in contact with water (cooling) may cause rapid evaporation and/or a steam explosion. Additionally, breaching molten silicon may contact other materials with a flash point below the melting point of the breaching molten silicon resulting in fires.

Failures, explosions, and/or fires in connection with the silicon casting furnaces may represent safety issues or reliability issues. Two known measures exist to mitigate these issues. The first measure is using a thermal blanketing material placed between steel walls and the silicon source to act as a silicon collection medium. Unfortunately, the thermal blanketing material is insulative, which limits furnace performance and/or allows silicon to remain in a liquid state for an extended period. During certain steps of the casting process (solidification or crystallization), heat is removed from the furnace, such as by cooling water flowing through a copper plate. Placing a thermal blanketing material over the copper plate to protect the copper plate in the event of a silicon breach significantly reduces cooling and affects throughput of the furnace.

Since the thermal blanketing material holds the heat in the molten silicon, there can be an increased risk of infiltration of liquid silicon through the blanket to the steel wall. A thermal blanketing material (alumina) acts as an insulator allowing escaped silicon to pool and possibly superheat, such as by radiation from a heater element. The thermal blanketing material tends to compress allowing the molten silicon to run off and introducing superheated silicon in contact with structural elements or cooling elements.

The second known measure is to provide a highly-cooled copper plate (circulating water) as the main spill containment element. In theory the copper plate and the water rapidly extract the heat of fusion from the molten silicon to prevent damage to the copper and infiltration to the water below. Unfortunately, some reaction between the liquid silicon and the copper (melting point about 1085 degrees Celsius) takes place rending the copper plate unfit for subsequent use and unable to be repaired. An additional issue of the second known measure is the loss of cooling water. If the water flow were to stop or slow down during a breach, the copper plate would quickly be dissolved by the silicon, resulting in significant damage. Contact of molten silicon with copper results in silicon with impurities and the contaminated silicon is unfit for remelting in solar or semiconductor applications.

According to one embodiment, this invention may include the use of carbon-carbon composite (C—C) or carbon fiber composite (CFC) in unique shapes to both line the lowest portions of a casting furnace chamber and to provide volumetric containment of any free liquid silicon. The containment apparatus may desirably direct liquid silicon to collection areas and containment areas through the use of C—C surfaces with specifically shaped graphite vias or pathways. The C—C material may include high thermal conductivity, resulting in rapid solidification of contacted silicon. In addition, the reaction between C—C material and liquid silicon may be self limiting, such as the C—C material does not require water cooling for preservation of the liner over relevant time periods.

The apparatus of this invention may be passive (gravity-driven), stable, and fast-acting. In contrast the known insulative spill blanket is slow-acting and the known water-cooled copper table is active.

The apparatus and the method of this invention may be tailored specifically for environments and issues encountered during silicon melting and casting. Other containment applications are within the scope of this invention, such as metal manufacturing, refractory preparation, semiconductor processes, other high temperature liquid applications, and/or the like.

According to one embodiment, this invention includes a spill containment system with one or more spill pathways directing liquid silicon (or other metal) to one or more spill trays located at low points or bilge within a furnace vessel. The containment trays or pans may be constructed of C-C composite materials to contain and solidify liquid silicon with minimized risk of loss of the tray. The casting device may be arranged or configured such that all exposed surfaces and spill paths are fitted with trays, preventing contact between liquid silicon and furnace walls, structural elements, cooling elements, and/or the like.

The scope of this invention may include designing high temperature spill paths to one or more integral and/or unibody (single piece) spill containment trays fabricated from C—C composite materials. Desirably, the trays may include geometries which conform closely to interior surfaces of vessels. Other materials could potentially be used in this application.

The containment apparatus of this invention may be used at any location and/or step of the casting process, such as during a melting step, during a superheating step, during a refining step, during a purification step, during a holding step, during an accumulating step, during a solidification step, during a crystallization step, and/or the like. The scope of this invention includes single vessel casting processes as well as multi-vessel casting processes, for example, 3 stages with separate melting, holding, and solidifying.

According to one embodiment, this invention includes components made from carbon fiber reinforced carbon or carbon-fiber composite which can be referred to as C—C. The C—C material can withstand high processing temperatures in inert or non-oxidizing environments while providing sufficient mechanical integrity and rigidity to contain breaching silicon.

Desirably, this invention includes containment in high temperature processes. High temperature broadly includes elevated or increased temperatures, such as at least about 500 degrees Celsius, at least about 1000 degrees Celsius, at least about 1400 degrees Celsius, at least about 1420 degrees Celsius (melting point of silicon), at least about 1450 degrees Celsius, at least about 1500 degrees Celsius, and/or any other suitable number or range.

According to one embodiment, the members and the components of the containment apparatus may be integrally formed in a generally unitary structure, such as during the composite fabrication process where the lay-up and the pyrolysis form a singular member. In the alternative, members and components of the containment apparatus may each be independently fabricated.

C—C materials and/or parts may generally be formed by laying-up and/or arranging carbon fiber filament and/or carbon fiber cloth into the desired shape. Single and/or multiple layers of material can be used and desirably different layers include different orientations and/or patterns, such as a first layer having a first orientation and a second layer having about a generally perpendicular orientation to the first layer. The use of continuous filaments, staple fibers, bulk fibers, woven fabrics, and/or nonwoven fabrics is within the scope of this invention. Unidirectional, bidirectional, and/or multidirectional filament or fabric orientations are possible.

The lay-up can be coated with organic binder or pitch, such as containing coke or another carbon source. The lay-up can be heated or warmed to perform pyrolysis (elevated temperatures with reduced and/or no oxygen) and to form a generally pure carbon. Voids formed from the pyrolysis can be reduced or filled in by contact with a carbon depositing or forming gas, such as acetylene at high temperature for extended periods and/or several days. The elevated temperature may also promote and/or grow larger graphite crystals. Optionally, a graphite foil may be included over the C—C material, such as laminated to seal the C—C material.

According to one embodiment, the members and the components of the containment apparatus may include a ceramic material, such as a high temperature ceramic that can withstand the elevated temperatures and/or non-oxidizing atmosphere. High temperature ceramics may include aluminum oxide, aluminum nitride, aluminum silicate, boron nitride, zirconium phosphate, zirconium diboride, hafnium diboride, and/or the like.

According to one embodiment, the members and the components of the containment apparatus may include carbon fiber composite. Combinations of ceramics and C—C parts are within the scope of this invention. This invention may include other materials used or integrated into the apparatus, such as silicon carbide (SiC) or silicon (Si) coatings on CFC members.

The apparatus may contain any suitable mass at any suitable temperature, such as a mass of at least about 500 kilograms of a feedstock at a temperature of at least about 1420 degrees Celsius. Desirably, the apparatus can withstand superheat above a melting point of the feedstock, such as at least about 10 degrees Celsius of superheat, at least about 25 degrees Celsius of superheat, at least about 50 degrees Celsius of superheat, and/or any other suitable value.

A volume of the containment apparatus may include any suitable amount or quantity, such as at least about 0.1 meters cubed, at least about 0.2 meters cubed, at least about 0.5 meters cubed, at least about 0.8 meters cubed, at least about 1.0 meters cubed, and/or the like. The molten feedstock may include high purity silicon and/or any other suitable material.

The containment apparatus may hold any suitable amount or quantity of liquid silicon and/or solid silicon, such as at least about 100 kilograms, at least about 200 kilograms, at least about 500 kilograms, at least about 750 kilograms, at least about 1000 kilograms, and/or the like.

According to one embodiment, the C—C liner contains the liquid silicon, such as to freeze within the C—C liner making the silicon in turn much safer. The safety of the casting process may include containing a full volume of liquid silicon with no reaction to the steel skin of the casting chamber or furnace.

FIG. 1 illustrates a partial isometric view of a casting device 50 (melting, holding, and/or solidifying), according to one embodiment. The casting device 50 includes a containment apparatus 10 with a shielding member 12, such as for protecting structural elements 14 and/or cooling elements 16. Cooling element 16 may include a metal slab, a heat sink, a cooling water line, and/or the like. The containment apparatus 10 includes a gabled structure 24 and a U-shaped pan 38, such as with a volume 62 for containing molten silicon.

FIG. 2 illustrates an isometric view of a gabled structure 24, according to one embodiment of the containment apparatus 10. The gabled structure 24 may form a shielding member 12. The triangular shape of the gabled structure 24 includes a ridge 34 dividing the top surface into two angled planar sections. The gabled structure 24 also includes a lip 26 and a drip edge 36, such as for directing molten silicon flow. The gabled structure 24 includes apertures 28 with collars 22, such as forming a first row 30 and a second row 32. The ridge 34 includes an aperture 28 with a collar 22 near the lip 26.

FIG. 3 illustrates an isometric view of a U-shaped pan 38, according to one embodiment of the containment apparatus 10. The U-shaped pan 38 includes sides 20 and a bottom 18 to form a volume 62. The U-shaped pan 38 includes trays 40 with joints 42 held or secured by fasteners 48. The U-shaped pan 38 also includes legs 44 and a connecting section 46.

Figure 4:
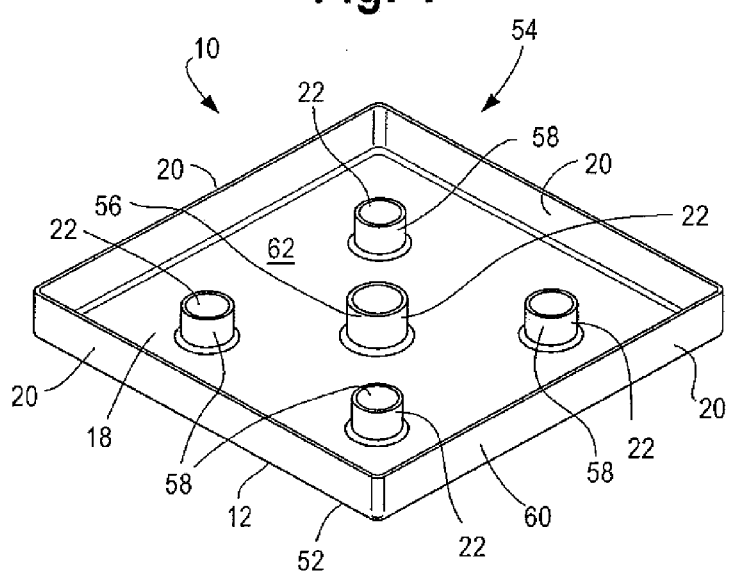
FIG. 4 illustrates an isometric view of a containment apparatus, according to one embodiment.

FIG. 4 illustrates an isometric view of a containment apparatus 10, according to one embodiment. The containment apparatus 10 includes a square shape 54 with sides 20 and a bottom 18 to form a volume 62. The containment apparatus 10 may include the shielding member 12 and the volume 62, such as in an integral unit 52 and/or a unibody 60. The bottom 18 includes a plurality of openings with collars 22. The collars 22 include a central collar 56 and corner collars 58.

Moreover, although casting of silicon has been described herein, other semiconductor materials and nonmetallic crystalline materials may be cast without departing from the scope and spirit of the invention. For example, the inventors have contemplated casting of other materials consistent with embodiments of the invention, such as germanium, gallium arsenide, silicon germanium, aluminum oxide (including its single crystal form of sapphire), gallium nitride, zinc oxide, zinc sulfide, gallium indium arsenide, indium antimonide, germanium, yttrium barium oxides, lanthanide oxides, magnesium oxide, calcium oxide, and other semiconductors, oxides, and intermetallics with a liquid phase. In addition, a number of other group III-V or group II-VI materials, as well as metals and alloys, could be cast according to embodiments of the present invention.

Cast silicon includes multicrystalline silicon, near multicrystalline silicon, geometric multicrystalline silicon, and/or monocrystalline silicon. Multicrystalline silicon refers to crystalline silicon having about a centimeter scale grain size distribution, with multiple randomly oriented crystals located within a body of multicrystalline silicon.

Geometric multicrystalline silicon or geometrically ordered multicrystalline silicon refers to crystalline silicon having a nonrandom ordered centimeter scale grain size distribution, with multiple ordered crystals located within a body of multicrystalline silicon. The geometric multicrystalline silicon may include grains typically having an average about 0.5 centimeters to about 5 centimeters in size and a grain orientation within a body of geometric multicrystalline silicon can be controlled according to predetermined orientations, such as using a combination of suitable seed crystals.

Polycrystalline silicon refers to crystalline silicon with micrometer to millimeter scale grain size and multiple grain orientations located within a given body of crystalline silicon. Polycrystalline silicon may include grains typically having an average of about submicron to about micron in size (e.g., individual grains are not visible to the naked eye) and a grain orientation distributed randomly throughout.

Monocrystalline silicon refers to crystalline silicon with very few grain boundaries since the material has generally and/or substantially the same crystal orientation. Monocrystalline material may be formed with one or more seed crystals, such as a piece of crystalline material brought in contact with liquid silicon during solidification to set the crystal growth. Near monocrystalline silicon refers to generally crystalline silicon with more grain boundaries than monocrystalline silicon but generally substantially fewer than multicrystalline silicon.

According to one embodiment, this invention may include a containment apparatus suitable for use in producing high purity silicon. The apparatus may include a shielding member adapted to prevent breaching molten silicon from contacting structural elements or cooling elements, and a volume adapted to hold a quantity of breaching molten silicon with the volume formed by a bottom and one or more sides.

The term "containment apparatus" broadly refers to a device or system to catch, collect, hold, solidify, and/or any other suitable action to reduce issues of molten or liquid silicon breach, spill, or escape.

The term "breaching" broadly refers to being outside of the designated or designed area or location, such as to spill and/or leak. Breaching may occur during transfer processes between two vessels, such as a holding vessel and a solidifying crucible. Breaching may also occur from failure of a component, such as a fracture or a crack in a crucible.

The term "shielding member" broadly refers to any suitable protective device or structure designed to separate, isolate, and protect structural elements or cooling elements, such as by isolating, deflecting, or diverting a flow of molten silicon into a different direction or location. The shielding member may include any suitable size and/or shape. Desirably, the shielding member at least generally conforms to the shape of the casting station or the furnace.

The term "structural elements" broadly refers to casting station or furnace components, such as support members, load-bearing beams, insulating parts, walls, and/or the like. Structural elements may be generally fixed and/or may be generally movable, such as part of an actuation mechanism for tipping a crucible.

The term "cooling elements" broadly refers to devices and/or parts that remove and/or reduce at least a portion of heat and/or temperature from a portion of the casting station or the furnace, such as active or passive heat sinks. According to one embodiment, the cooling elements include water-cooled copper components. In the alternative, the cooling elements may include a peltier cooler, a thermoelectric cooler, a thermionic cooler, a solid state cooler, and/or the like. The cooling elements may include any suitable size and/or shape. The cooling elements may have any suitable heat duty, such as removing at least about between about 1 kilowatts and about 10,000 kilowatts, between about 10 kilowatts and about 1,000 kilowatts, about 500 kilowatts, and/or the like.

The term "volume" broadly refers to an amount of space occupied in three-dimensions, such as measured in cubic units. The volume may include any suitable size and/or shape. Desirably, the volume at least generally conforms to the shape of the casting station or the furnace.

The volume may be formed and/or bounded by any suitable components, such as a bottom and one or more sides. The term "bottom" broadly refers to a lower section and/or surface, such as may be having a generally planar shape. The bottom may include any suitable size and/or shape. The term "sides" broadly refers to any suitable lip, wail, raised structure, and/or the like. The sides may include any suitable size and/or shape. There may be any suitable number of walls, such as at least about 1, at least about 3, at least about 4, at least about 6, at least about 8, at least about 10, and/or the like. The sides may form any suitable cross sectional shape, such as generally circular, generally elliptical, generally triangular, generally square, generally rectangular, generally hexagonal, generally octagonal, generally irregular, and/or the like.

According to one embodiment, the containment apparatus may include one or more collars protruding from the shielding member or the bottom to protect structural elements or cooling elements. Structural elements or cooling elements may penetrate or protrude through a portion of the containment apparatus and the collar may provide protection from liquid silicon for the elements, such as to keep away or divert the silicon from the structural elements or the cooling elements. The collar may be integrally formed into the containment apparatus.

The collar may include any suitable size and/or shape. The collar may include a generally circular shape, a generally square shape, a generally rectangular shape, and/or any other shape at least somewhat conforming to the structural element or the cooling element. The collar may include any suitable height, such as at least about tall as the sides, at least about 1 centimeter, at least about 2 centimeters, at least about 5 centimeters, at least about 10 centimeters, and/of the like. The collars may form part of the boundary or limit of the volume.

According to one embodiment, the shielding member may include a gabled structure. The term "gable" broadly refers to a vertical triangular end, such as a generally roof-like shape or a wedge-shape. The gabled structure may include any suitable angle measured from horizontal at the center line, such as at least about 2 degrees, at least, about 5 degrees, at least about 10 degrees, at least about 15 degrees, and/or the like. Desirably, the gabled structure includes a length greater than a width. The gabled structure may include a unibody one piece design and/or may include a multiple piece design. The gabled structure may include any suitable height or peak. The gabled structure may be used in combination with or under any suitable casting equipment, such as a holding vessel to accumulate molten silicon from one or more melters. Other shapes for the shielding member are possible, such as a generally convex shape, a generally concave shape, an arcuate shape, a symmetrical arcuate shape, a gambrel shape, and/or the like.

The gabled structure may include a drip edge or flashing, such as to aid or promote flowing of the molten silicon into the volume. The drip edge may include a generally curved section and a generally vertical section. The drip edge may include any suitable size and/or shape. The drip edge may be on any suitable border of the gabled structure, such as on three sides of the gabled structure in a generally U-shape. Desirably, the drip edge at least somewhat follows a contoured shape of the gabled structure.

The gabled structure may include an end with a lip for directing molten silicon into the volume, such as the molten silicon flows at least generally away from and/or along the lip. The lip may include any suitable size and/or shape. The lip may include a generally vertical section and a generally horizontal section. Desirably, the lip at least somewhat follows the contoured shape of the gabled structure. The lip may be located in any suitable position, such as in the rear area of a holding device with a crucible that tips away from the lip when transferring a charge of molten silicon.

A top, an elevated part, and/or a high point of the gabled structure may form or constitute a ridge, such as a generally in the middle of the gabled structure with a generally linear shape. The gabled structure may include at least two apertures or holes disposed on each side of the ridge of the gabled structure. The apertures may include any suitable size and/or shape. The apertures may allow structural elements or cooling elements to pass through a portion of the gabled structure. The apertures may include collars to further protect the structural elements or cooling elements. The apertures may include any suitable size and/or shape.

According to one embodiment, the apertures may include a generally rectangular shape, such as with generally rounded corners. Desirably, but not necessarily, the apertures may be aligned two across from each other, such as in a first row and a second row. The first row may be closest to the lip. The length of the apertures in the first row may include a distance. The length of apertures in the second row may include a longer distance than the apertures in the first row, such as at least about 1.5 times, at least about 2.0 times, and/or the like.

The apertures may include collars, such as for protecting the structural elements and/or the cooling elements, as discussed above. According to one embodiment, the gabled structure may include an aperture disposed on the ridge of the gabled structure, such as having a generally rectangular shape disposed or located generally transverse or perpendicular to the other apertures and located with respect to the lip.

According to one embodiment, the containment apparatus may include a generally U-shaped pan forming the volume and disposed generally under edges or borders of other components or a part of the containment apparatus, such as the gabled structure. Other shapes and/or configurations of the pan are within the scope of this invention. The U-shaped pan may include any suitable size and/or shape. The U-shaped pan may form or provide the volume for containing molten silicon, such as with a bottom and at least one side.

The U-shaped pan may include sides with any suitable height. The U-shaped pan may include legs with any suitable length and any suitable width. A connecting section (not the legs) of the U-shaped pan may include any suitable length and any suitable width. According to one embodiment, the U-shaped pan may include an integral or unibody design. In the alternative, the U-shaped pan may include a plurality of trays with sides and in fluid communication with each other, such as by notches or cuts in the sides where one or more adjacent trays connect. Desirably, the sides of the trays connecting to other trays have a spillway, a dam, a baffle, a weir, and/or other suitable configuration, such as to form a flange for mating with adjacent trays. The spillway desirably has a height less than a side wall height of the tray. The breached or spilled molten silicon may flow into a tray and then fill up to the spill way height before flowing into an adjacent or joining tray. The multi-tray configuration may allow or provide for isolation of the silicon and replacement or change out of less than an entire pan. The U-shaped pan may include any suitable number of trays, such as about 1, about 2, about 3, about 4, about 5, about 6, about 7, about 8, about 10, about 15, and/or the like. The legs may include each 2 trays and the connecting section may include 4 trays, for example. The trays may be of the same or different (varying) sizes.

The trays may include any suitable size and/or shape, such as generally rectangular or generally square. The trays may include a length at least greater than a width, such as at least about 1.5 times, at least about 2.0 times, at least about 2.5 times, and/or the like. The trays may include any suitable height, such as to form a volumetric containment space. The height may include any suitable distance, such as about 0.1 times a length, about 0.2 times a length, about 0.3 times a length, about 0.5 times a length, and/or the like. Trays of differing sizes and combinations of trays of differing sizes are within the scope of this invention. Shapes other than U-shape for individual or multi-tray components are within the scope of this invention.

The multiple tray configuration may be fabricated in smaller C—C composite furnaces and/or to facilitate the fabrication process. Multiple trays may be arranged or overlapping, such as to form a shingle-like configuration. The volume and the shielding member may be anchored, secured, or clamped into the casting device, such as with fasteners. Desirably, a number of penetrations or potential leak points may be minimized.

The term "fluidly connecting" and/or "in fluid communication" broadly includes a liquid or a gas being able to flow, transport, and/or pass from a first location to a second location. Fluid connections may be made by any suitable manner, such as with channels, ducts, pipes, tubing, spill-ways, conduits, baffles, weirs, placing items in close proximity, and/or the like.

The trays may be combined in any suitable manner, such as to prevent a spill or loss of control of the molten silicon. The joints or the seams of the trays may be combined with or by a gasket material, such as graphite felt and/or the like in between sections of the trays. One or more mechanical fasteners or clamps may be used to join the trays together, such as bulk head fittings, or nuts with bolts. The fasteners may be made of any suitable high temperature material, such as graphite, carbon-carbon, alloy, ceramic, and/or the like.

The trays may be combined by any suitable number of fasteners, such as at least about 2, at least about 4, at least about 6, at least about 8, at least about 13, at least about 15, at least about 20, and/or the like. According to one embodiment, the joint may be closed using 6 fasteners spaced generally equally apart, such as in a lip of the bottom and the sides of the trays forming the legs. Similarly, the joint may be closed using 8 fasteners (shorter joint) or 13 fasteners (longer joint) spaced generally equally apart, such as in a lip of the bottom and the sides of the trays forming the connecting section. The lip may be inward and/or outward oriented, such as to form a flange.

In the alternative, the trays can be arranged in overlapping or shingled arrangement to generally maintain fluid containment. The containment apparatus may be located or positioned in a melting device, a holding device, a solidifying device, or a single device used for melting, holding and solidifying, for example. The plurality of trays of any may include a perimeter or border with a continuous side wall for molten silicon containment.

According to one embodiment, the shielding member and the volume may form an integral unit, such as with a singular piece of C—C material. In the alternative, the shielding member and the volume may form two or more separate and distinct units, such as more than one piece of C—C material.

According to one embodiment, the bottom of the volume may include a generally square shape or a generally rectangular shape with four sides, such as for containment of molten silicon. The generally square shape may be placed under a solidifying or crystallizing chamber and/or any other suitable device. The apparatus may also include a central collar with four corner collars disposed generally radially from the central collar, such as for structural elements or the cooling elements passing through a portion of the apparatus. The arrangement of collars may include a configuration similar to the 5 dots disposed on one side of a die. The collars may include any suitable diameter and/or height. The central collar may include a diameter equal to or larger than the corner collars, such as at least about 1.5 times, at least about 2 times, and/or the like. The height of the collar may be about generally equal to a height of the sides and/or any other suitable distance.

The components or elements of the apparatus may include any suitable thermal conductivity and/or heat capacity. Desirably, the components conduct heat sufficiently rapidly to solidify the breached molten silicon, while not damaging the structural elements or the cooling elements. The thermal conductivity may be at least about 0.5 watt per meter per Kelvin, at least about 0.75 watt per meter per Kelvin, at least about 1.0 watt per meter per Kelvin, at least about 2.0 watt per meter per Kelvin, at least about 3.0 watt per meter per Kelvin, at least about 5.0 watt per meter per Kelvin, at least about 7.5 watt per meter per Kelvin, at least about 10 watt per meter per Kelvin, and/or the like, As used herein the terms "having", "comprising", and "including" are open and inclusive expressions. Alternately, the term "consisting" is a closed and exclusive expression. Should any ambiguity exist in construing any term in the claims or the specification, the intent of the drafter is toward open and inclusive expressions.

Regarding an order, number, sequence and/or limit of repetition for steps in a method or process, the drafter intends no implied order, number, sequence and/or limit of repetition for the steps to the scope of the invention, unless explicitly provided.

According to one embodiment, this invention may include a method of containing molten silicon suitable for use in producing high purity silicon. The method may include the step of breaching or spilling a portion of molten silicon from a casting process, and the step of preventing the molten silicon from contacting structural elements or cooling elements with a shielding member. The method may also include the step of holding or containing a quantity of the molten silicon in a volume formed by a bottom and one or more sides.

The step of breaching includes spilling and/or otherwise loosing positive control over a portion of the molten silicon, such as to flow out of, to spread beyond the bounds of, or to run over a portion of the casting device resulting in molten silicon being outside of a crucible, tundish and/or other suitable processing device.

The step of preventing molten silicon from contacting structural elements or cooling elements with a shielding member may include deflecting, diverting, covering, protecting, and/or the like, such as to not damage the structural elements or the cooling elements.

The step of holding a quantity of molten silicon in a volume formed by a bottom and one or more sides includes collecting, containing, catching and/or otherwise gaining control of the spilled molten silicon. According to one embedment, the molten silicon of this invention may also include solid chunks or pierces of unmelted feedstock along with the liquid.

According to one embodiment, the step of breaching occurs during transferring or pouring between casting devices. In the alternative, the breaching occurs from a failure or crack of or in the casting device or crucible.

Desirably, the method may include solidifying the molten silicon in the volume, such as lowing the molten feedstock below the solidification temperature (about 1420 degrees Celsius), or removing the superheat and the heat of fusion (about 50.21 kJ-mol-1) from the liquid. The containment apparatus and method of this invention may solidify the breaching silicon in any suitable amount of time, such as less than about 30 minutes, less than about 15 minutes, less than about 5 minutes, less than about 1 minute, less than about 30 seconds, and/or the like. Similarly, the spilled silicon may be reused in subsequent casting processes since the contamination level remains low (without copper exposure).

According to one embodiment of the method, the shielding member, the bottom, and the one or more sides may include carbon fiber composite and/or any other suitable material. A portion of the molten silicon may react with a portion of the surface of the carbon fiber composite, such as to form silicon carbide. The reaction to form silicon carbide may be self limiting and not significantly damage the containment apparatus, such as the containment apparatus may be used again.

According to one embodiment, the method may include the step of flowing or directing a portion of the molten silicon over and/or along a portion of a gabled structure and into a generally U-shaped pan, such as in a two part containment apparatus.

EXAMPLE

To test the integrity of the containment apparatus of this invention, a C—C square pan was made with four sides and a smooth bottom. The pan was placed in a conventional casting crucible in the event of leakage. The pan had a graphite foil coating applied to the interior surfaces, but the improper side of the foil coating was facing outward.

Molten silicon (above 1400 degrees Celsius) was poured into the pan with over 80 percent of a volume of the pan being filled. The mass of the molten silicon was about 45 kilograms. To accelerate the test, the molten silicon was solidified by exposure to a heat sink. The pan contained the molten silicon with no breaching or loss of containment (no penetration of the pan). The block of solidified silicon was tilted and removed from the pan resulting in slight adherence or sticking to a central portion of the pan (less than about 15 percent of the bottom surface). The adherence occurred from the improperly applied graphite foil. The solidified silicon was suitable for reuse or remelt into solar applications. The pan was not suitable for reuse due to the graphite foil and adherence issues that resulted in partial delamination of the bottom of the pan.

It will be apparent to those skilled in the art that various modifications and variations can be made in the disclosed structures and methods without departing from the scope or spirit of the invention. Particularly, descriptions of any one embodiment can be freely combined with descriptions or other embodiments to result in combinations and/or variations of two or more elements or limitations. Other embodiments of the invention will be apparent to those skilled in the art from consideration of the specification and practice of the invention disclosed herein. It is intended that the specification and examples be considered exemplary only, with a true scope and spirit of the invention being indicated by the following claims.

What is claimed is:

1. A containment apparatus suitable for use in producing high purity silicon, the apparatus comprising:
    a shielding member adapted to prevent breaching molten silicon from contacting structural elements or cooling elements; and
    a volume adapted to hold a quantity of breaching molten silicon, and the volume formed by a bottom and one or more sides;
    wherein the shielding member comprises a gabled structure.

2. The apparatus of claim 1, wherein the gabled structure comprises an end with a lip for directing molten silicon into the volume.

3. The apparatus of claim 2, further comprising at least two apertures disposed on each side of a ridge of the gabled structure.

4. The apparatus of claim 3, further comprising an aperture disposed on the ridge of the gabled structure.

5. The apparatus of claim 1, further comprising a generally U-shaped pan forming the volume and disposed generally under edges of the gabled structure.

6. The apparatus of claim 5, wherein the generally U-shaped pan comprises a plurality of trays with sides and in fluid communication with each other.

7. The apparatus of claim 1, further comprising a central collar with four corner collars disposed generally radially from the central collar and wherein the bottom comprises a generally square shape or a generally rectangular shape with four sides.

* * * * *